US007624362B2

(12) United States Patent
Nakamura

(10) Patent No.: US 7,624,362 B2
(45) Date of Patent: Nov. 24, 2009

(54) CIRCUIT ANALYSIS DEVICE USING PROCESSOR INFORMATION

(75) Inventor: Tsuyoshi Nakamura, Fukuoka (JP)

(73) Assignee: Panasonic Corporation, Osaka (JP)

( * ) Notice: Subject to any disclaimer, the term of this patent is extended or adjusted under 35 U.S.C. 154(b) by 343 days.

(21) Appl. No.: 11/649,804

(22) Filed: Jan. 5, 2007

(65) Prior Publication Data

US 2007/0234147 A1 Oct. 4, 2007

(30) Foreign Application Priority Data

Jan. 11, 2006 (JP) ............................ 2006-003810

(51) Int. Cl.
*G06F 17/50* (2006.01)

(52) U.S. Cl. .................... 716/4; 716/5; 716/6; 714/10; 714/724

(58) Field of Classification Search ................ 716/4-6; 714/10, 724
See application file for complete search history.

(56) References Cited

U.S. PATENT DOCUMENTS 5,544,342 A * 8/1996 Dean .......................... 711/119
5,901,281 A * 5/1999 Miyao et al. .................. 714/11
6,597,727 B2 * 7/2003 Philips et al. ............... 375/147
2001/0008023 A1 * 7/2001 Bond et al. .................... 717/8
2002/0066088 A1 * 5/2002 Canut et al. ................. 717/151
2004/0098708 A1 * 5/2004 Taruki et al. ................ 717/138
2005/0216701 A1 * 9/2005 Taylor ......................... 712/34

OTHER PUBLICATIONS

David Brooks et al., "Wattch: A Framework for Architectural-Level Power Analysis and Optimizations", Proceedings of the 27th International Symposium on Computer Architecture, Jun. 2000, Vancouver, BC, pp. 83-94.

* cited by examiner

*Primary Examiner*—Naum B Levin
(74) *Attorney, Agent, or Firm*—Wenderoth, Lind & Ponack, L.L.P.

(57) ABSTRACT

A circuit analysis device comprises a first storing unit operable to store an execution object which can operate on a real processor and includes information of a logical circuit, an analyzing unit operable to analyze operation which is based on the function of the logical circuit and is coordinated with a target processor, through the operation of the execution object on the real processor, and a second storing unit operable to store processor information which the analyzing unit uses. Herein, the processor information includes difference information between operation specifications of the real processor and operation specifications of the target processor. The circuit analysis device can estimate the processing load of the target processor and the power consumption of an application in high accuracy at the early stage of development of a system LSI.

15 Claims, 4 Drawing Sheets

4
processor information
11
external memory
2
12
target processor
13
internal memory
logical circuit
14
cache
execution object

| | |
|---|---|
| codeA0 | codeTA0<br>codeTA1 |
| codeB0 | callT |
| codeC0 | codeTC0 |
| codeC1 | codeTC1<br>codeTC2 |

CIRCUIT ANALYSIS DEVICE USING PROCESSOR INFORMATION

BACKGROUND OF THE INVENTION

1. Field of the Invention

The present invention relates to a circuit analysis device operable to make performance evaluation of LSI at the early stage of development.

2. Description of the Related Art

With the demand of miniaturization and weight saving of a portable terminal and digital equipment, it has been earnestly desired to realize the function of various applications by an LSI. Especially, it is desired to develop a system LSI in which the function of various applications can be realized by a processor and a logical circuit.

One kind of the system LSI is constructed with a single LSI which possesses a processor and a logical circuit in it, and the other kind of system LSI is constructed with an LSI possessing a processor and an LSI possessing a logical circuit.

In the system LSI, a processor that is most suitable to the kind and specifications of the application is used. A processor to be used by the system LSI which realizes the application (in other words, a processor to be installed in the application) is called as a “target processor.”

With the decrease of the operation voltage of the system LSI, the power consumption of the system LSI tends to be occupied more by the power consumption due to signal exchange to external circuits, than by the power consumption due to the operation of internal circuits of the system LSI. This is because even if the operation voltage of the LSI is decreased to a low voltage (2.5V or 1.8V, for example), the operation voltage of a circuit interfacing with the external circuits requires a high voltage (5V or 3.3V, for example).

The external circuits include an external memory which exists in the exterior of the system LSI, a target processor, and others.

In addition, the portable terminal and the digital equipment are demanded to improve the speed of processing as well as to balance the communication load between the target processor and the logical circuit which is included in the system LSI.

In such a situation, a severe, temporal requirement is posed on the product development of electronic equipment such as the portable terminal and the digital equipment. Thus, the system LSI, which is the core of the electronic equipment, is required to be developed in a short time. Along with the complication of a circuit and software, the development man-hour and development period of the system LSI are dramatically increased. For this reason, it is necessary to consider the architecture and specifications of the system LSI at the early stage of development.

If the accuracy of estimation of the power consumption due to the signal exchange between the system LSI and the external memory and the accuracy of estimation of the load of communication between the system LSI and the target processor are poor, it may be necessary to reconsider the specifications of the system LSI and its peripheral circuits, at the last stage of development of the system LSI. In some cases, it may be necessary to re-develop the system LSI from the beginning. Reconsideration of the specifications of the system LSI in the final stage of development is fatal for the electronic equipment in which a severe development period is demanded.

For this reason, in the system LSI development, before starting specific circuit design, high accuracy estimation is required for the power consumption due to signal exchange between the system LSI and the external memory, and the load of communication between the system LSI and the target processor.

In particular fields, such as image compression processing and audio compression processing, the object-coded logical circuit model operable to realize an application may be provided in the course of standardization. In order to decide detailed specifications, it is expected to estimate the power consumption and the communication load at an early stage using the logical circuit model.

In the past, an art has been disclosed, in which an operation analysis of the logical circuit described by the source code is performed using a high-universal instruction set of a processor.

According to the prior art, it is possible to perform the operation analysis of the logical circuit, based on the instruction set of the processor and the source code which describes the construction of the logical circuit.

Moreover, Document 1 (Brooks, et, al.; ISCA, pp. 83-94, 2000) discloses an art which performs the operation analysis of the logical circuit described by the source code, using a virtual processor model comprising the instruction and cache information of a specific target processor.

Conventionally, in the early stage of development, these prior arts were used in order to estimate the power consumption and the communication load.

However, the prior arts possess the following problems.

In the operation analysis using the universal instruction set of a processor, it is impossible to analyze the power consumption due to the signal exchange to the external memory and the load of communication with the processor. This is because the communication frequency and the power consumption due to the communication can not be calculated only by the instruction set of the processor. In addition, since the information of the external memory and the information of the internal memory and cache of the processor are not available, it is impossible to analyze the access frequency at which the logical circuit accesses the internal memory or the cache.

On the other hand, in the operation analysis using the virtual processor model, the analysis of the power consumption and the analysis of the communication load are possible; however, it is necessary to design in advance the virtual processor model of the target processor. Thus, the virtual processor model is difficult to be used at the early stage of development.

In addition, in either art, the source code of the logical circuit is necessary to perform the operation analysis. Therefore, even if the logical circuit model described by the object code becomes available, it is impossible to perform the operation analysis.

Since the analysis is performed on a processor which is installed in a computer used for the analysis (the processor is called as a “real processor” in the following), the analysis is performed by the real processor which is different from the target processor.

It has been demanded to dissolve the difference between the real processor and the target processor and to perform the analysis of the power consumption and the communication load.

OBJECTS AND SUMMARY OF THE INVENTION

An object of the present invention is to provide a circuit analysis device which is operable to perform a high-accuracy estimation of the processing load of a target processor and the power consumption of an application, in an early phase of development of a system LSI, without the need to develop a virtual processor model in which the detailed operation is described.

A first aspect of the present invention provides a circuit analysis device comprising: a first storing unit operable to store an execution object which can operate on a real processor and includes a function of a logical circuit; an analyzing unit operable to analyze, through the operation of the execution object on the real processor, operation which is based on the function of the logical circuit and is coordinated with a target processor; and a second storing unit operable to store processor information used by the analyzing unit, wherein the processor information includes difference information indicative of difference between operation specifications of the real processor and operation specifications of the target processor.

According to the present structure, it is possible to operate the execution object on the real processor and to analyze the operation of the logical circuit which is coordinated with the target processor. Moreover, since the analysis can be completed with only the difference information between the real processor and the target processor, it is possible to perform the operation analysis of the logical circuit in the early stage of development of the system LSI.

A second aspect of the present invention provides the circuit analysis device as defined in the first aspect, wherein the difference information includes replacement information indicative of code replacement between an instruction code of the real processor and an instruction code of the target processor.

According to the present structure, the logical circuit included in the execution object can virtually perform the operation coordinated with the target processor.

A third aspect of the present invention provides the circuit analysis device as defined in the first aspect, wherein the difference information includes difference between specifications of an internal memory and an internal cache, both possessed by the real processor, and specifications of an internal memory and internal cache, both possessed by the target processor.

According to the present structure, the logical circuit included in the execution object can perform the virtual operation to the internal memory and the internal cache, both of which the target processor possesses.

A fourth aspect of the present invention provides the circuit analysis device as defined in the first aspect, wherein the difference information includes replacement information indicative of address replacement between an address used by the real processor and an address used by the target processor.

According to the present structure, the logical circuit included in the execution object can perform the virtual operation corresponding to the address space which the target processor possesses.

A fifth aspect of the present invention provides the circuit analysis device as defined in the first aspect, wherein the processor information includes information of an external memory which is accessed by the logical circuit.

A sixth aspect of the present invention provides the circuit analysis device as defined in the fifth aspect, wherein the analyzing unit analyzes access frequency at which the logical circuit accesses the external memory.

According to the present structures, it is possible to analyze the access frequency and access-based power consumption of the logical circuit included in the execution object when the logical circuit accesses the external memory.

A seventh aspect of the present invention provides the circuit analysis device as defined in the third aspect, wherein the analyzing unit analyzes access frequency at which the logical circuit accesses at least one of the internal memory and the internal cache, both possessed by the target processor.

According to the present structure, it is possible to analyze the capacity and operation specifications of the internal memory and internal cache of the target processor, the capacity and operation specifications being required by the logical circuit included in the execution object.

An eighth aspect of the present invention provides the circuit analysis device as defined by the first aspect, wherein the analyzing unit analyzes communication frequency at which the logical circuit communicates with the target processor.

A ninth aspect of the present invention provides the circuit analysis device as defined by the first aspect, wherein the analyzing unit analyzes processing load and power consumption of the target processor.

According to the present structures, it is possible to analyze the load of the target processor in processing what is required by an application, such as the logical circuit included in the execution object.

A tenth aspect of the present invention provides the circuit analysis device as defined by the first aspect, the circuit analysis device further comprising: a display unit operable to display an analysis result obtained by the analyzing unit.

According to the present structure, a user can confirm the analysis result easily.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENTS

Hereinafter, embodiments of the present invention are explained, referring to the accompanying drawings.

Embodiment 1

As mentioned above, in this description, a processor which is installed in a computer used for the analysis is called as a “real processor”, and a processor to be used for the system LSI which realizes the application (in other words, a processor to be included in the application) is called as a “target processor.”

Figure 1:
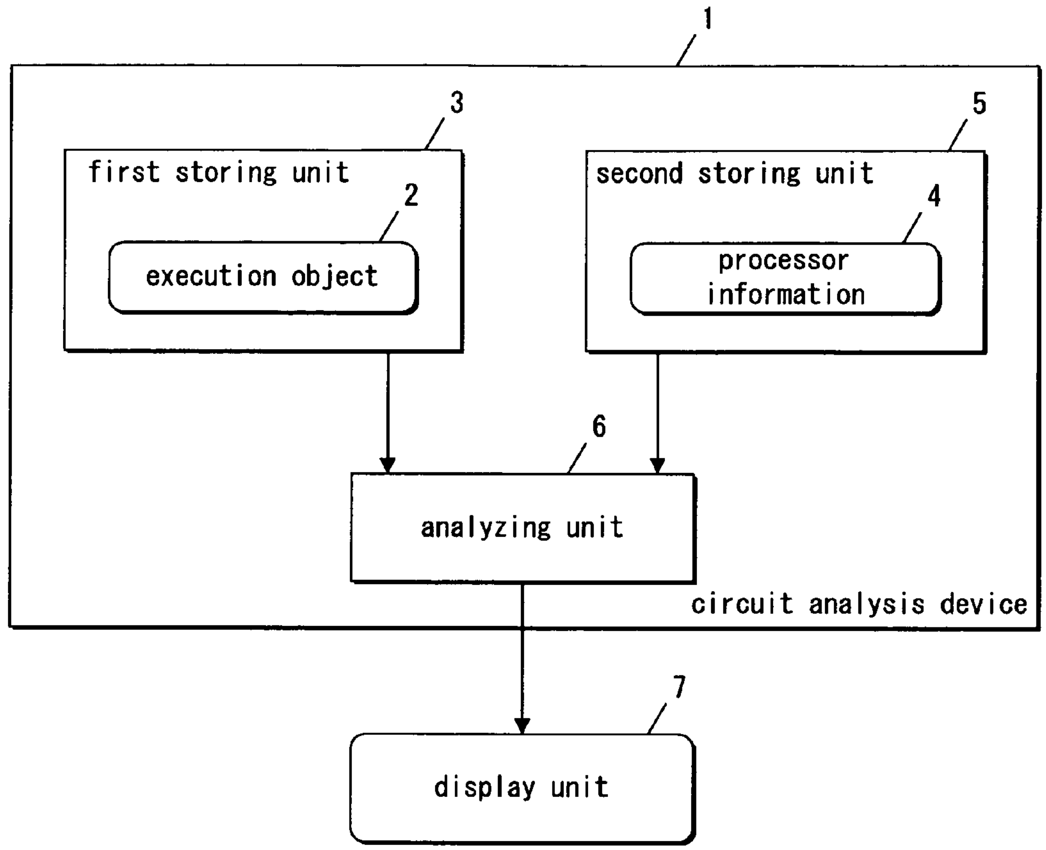
FIG. 1 is a block diagram illustrating a circuit analysis device in Embodiment 1 of the present invention.

FIG. 1 is a block diagram illustrating a circuit analysis device in Embodiment 1 of the present invention.

The circuit analysis device 1 comprises a first storing unit 3, a second storing unit 5, and an analyzing unit 6.

First, the details of each unit are explained.

The first storing unit 3 stores an execution object 2 including information of a logical circuit. The execution object 2 includes a function of the logical circuit which realizes an application to be developed. For example, the execution object 2 includes the function of the logical circuit which realizes operation based on the standard of image processing, such as MPEG-2 and MPEG-4.

The execution object 2 first describes the operation of the logical circuit in high-level languages, such as HDL and C language, then is converted into the object code which can operate on a computer. Moreover, the source code of the execution object 2 does not have to be a detailed description such as in the register transfer level (called as "RTL"), but may be a description in the behavior level.

An object code which is generated by compiling the source code described by a user may be used for the execution object 2. Alternatively, an object code available in the market may be used for the execution object 2.

Since the execution object 2 can operate on the real processor, the execution object 2 can operate on a computer.

In addition, since the circuit analysis device 1 can analyze the object-coded execution object 2 as it is, a user who uses the circuit analysis device 1 can perform analysis by only obtaining the execution object 2 which is object-coded beforehand. For this reason, the user does not need to take trouble in describing a new source code which realizes the operation of the application. Therefore, if the application is based on the standard of image processing and/or audio processing, the object-coded logical circuit model which may be supplied from the standard group can be used as it is.

For example, if a logical circuit included in an application is kept confidential, the source code corresponding to the application is hard to obtain. However, it is easy to obtain the logical circuit in the form of an object code or an encrypted object code. The circuit analysis device 1 can operate the object code and the encrypted object code on the real processor as the execution object 2. For this reason, even if the application is related to the latest standard, the object code is easily obtainable; therefore, the analysis can be easily performed by using the easily-obtainable object code.

A user uses the execution object 2, in the development of the desired application, especially in the analysis in the developmental phase of a system LSI which realizes the application.

The analyzing unit 6 analyzes the operation of the logical circuit which is coordinated with a target processor assumed by the user, by operating the execution object 2.

Here, the circuit analysis device 1 operates on a computer, such as a personal computer and a work station. In other words, the execution object operates on the real processor that is a substantial processor installed in the computer. For this reason, the operation of the logical circuit is analyzed as the coordinated operation with the real processor which the circuit analysis device 1 uses.

On the other hand, in the development of the application using the execution object 2, it is assumed that a processor which is selected according to the user's specifications is included in the application as the target processor. The specifications of the target processor often differ from the specifications of the real processor on which the circuit analysis device 1 operates.

Therefore, the processor information 4 described below is used for the analysis. Consequently, the analyzing unit 6 can analyze the operation which is based on the function of the logical circuit and is coordinated with the target processor (even though the execution object 2 including the function of the logical circuit operates on the real processor whose specifications are different from those of the target processor).

(Analysis)

Figure 2:
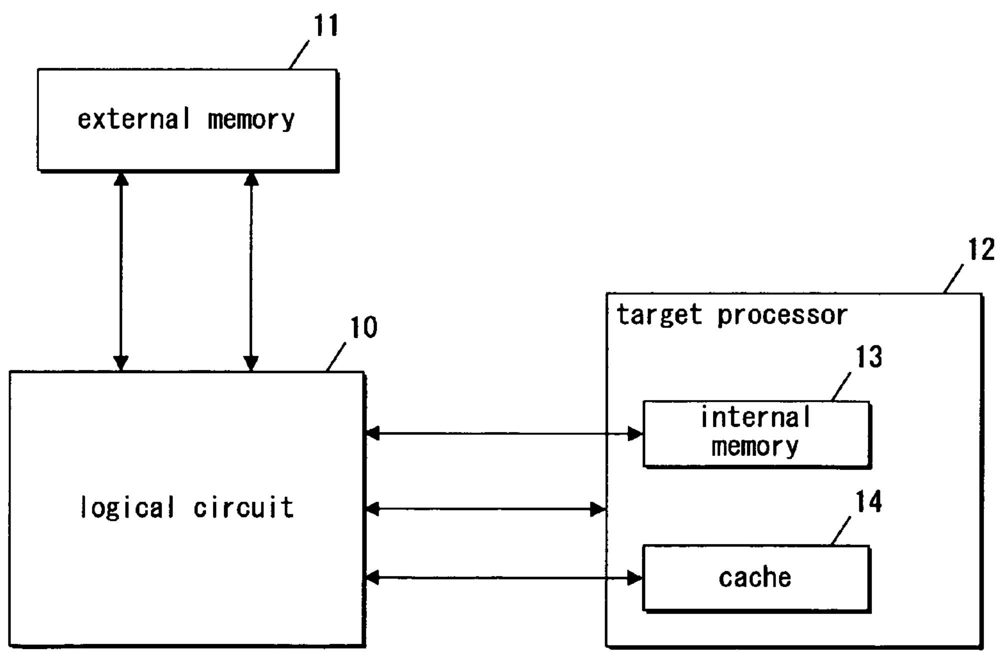
FIG. 2 is a diagram explaining an analysis in an analyzing unit in Embodiment 1 of the present invention.

The analyzing unit 6 analyzes the following operation in the operation of the logical circuit included in the execution object 2. The explanation is given with reference to FIG. 2. FIG. 2 is a diagram explaining an analysis in the analyzing unit in Embodiment 1 of the present invention.

Using the function of a logical circuit 10 included in the execution object 2 and processor information 4, the analyzing unit 6 analyzes the operation which is based on the function of the logical circuit 10 and is coordinated with the target processor.

The analyzing unit 6 analyzes the access frequency of the logical circuit 10 in accessing to an external memory 11. When the logical circuit 10 is included in the system LSI, the external memory 11 includes DRAM, SRAM, etc., installed externally to the system LSI. The analyzing unit 6 analyzes the number and frequency of read/write to the external memory 11, by the logical circuit 10. Through the analysis, the specifications for the logical circuit 10 in memory control and the necessary capacity and access speed of the external memory 11 are judged. Especially, in terms of the number of access and the frequency of access, the power consumption of the logical circuit 10 due to the access to the external memory 11 can be analyzed.

Moreover, the analyzing unit 6 analyzes the communication frequency between the logical circuit 10 and a target processor 12. The processing load of the target processor 12 is analyzed by the analysis of the communication frequency between the logical circuit 10 and the target processor 12. In addition, the power consumption of the entire application including the target processor 12 and the logical circuit 10 is analyzed by the analysis of the communication frequency between the logical circuit 10 and the target processor 12. The analyzing unit 6 also analyzes the power consumption of the target processor 12 alone.

The analyzing unit 6 also analyzes the access frequency of the logical circuit 10 in accessing to an internal memory 13 and a cache 14, installed inside of the processor 12. The hit ratio of the cache is analyzed by the analysis of the access frequency to the cache 14. The necessary capacity of the internal memory 13 is analyzed by the analysis of the access frequency to the internal memory 13.

(Use of Processor Information)

The analyzing unit 6 operates on the real processor included in the computer on which the circuit analysis device 1 operates. The specifications of the real processor are different from the specifications of the target processor which the application assumes. Therefore, in order to analyze the operation of the logical circuit that is coordinated with the target processor 12, the analyzing unit 6 needs to consider the difference between the real processor used for the actual operation and the target processor assumed by the application.

In order to fill up the difference between the real processor and the target processor, the analyzing unit 6 uses the processor information 4, in addition to the function of the logical circuit included in the execution object 2.

The second storing unit 5 stores the processor information 4.

The processor information 4 includes information which is necessary at the time of the execution of the analysis in the analyzing unit 6.

Figure 3:
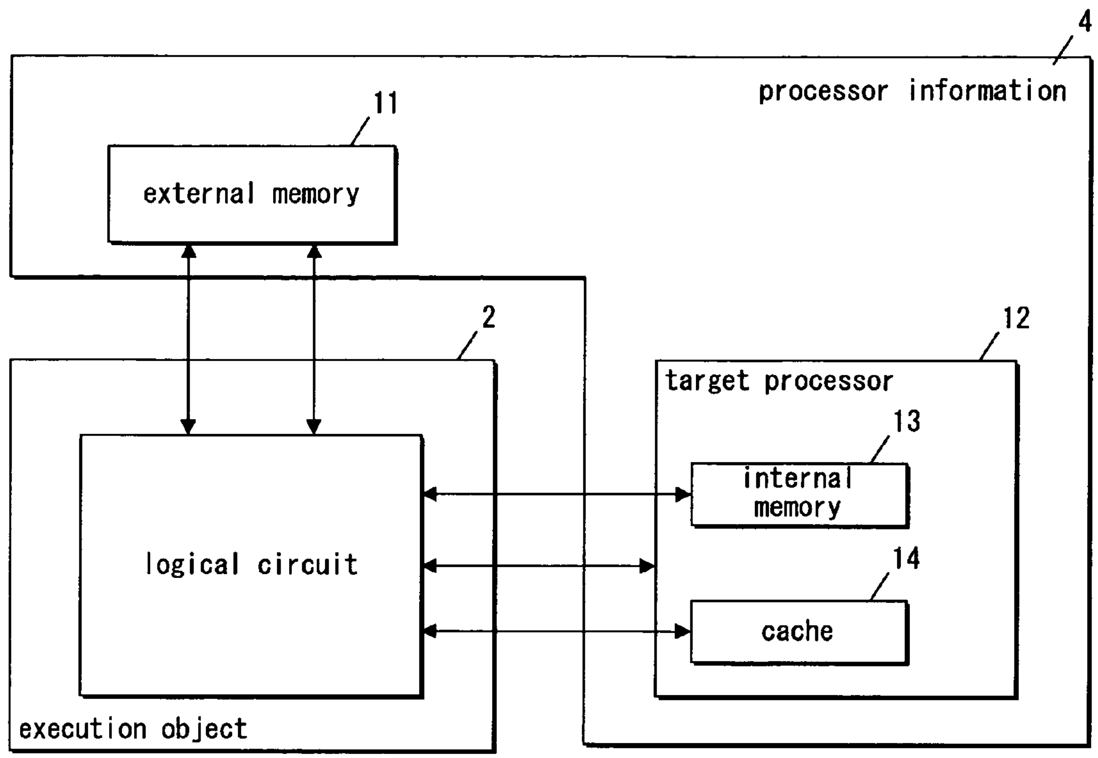
FIG. 3 is an explanatory drawing indicating information included in processor information in Embodiment 1 of the present invention.

FIG. 3 is an explanatory drawing indicating information included in the processor information in Embodiment 1 of the present invention.

The execution object 2 includes the information of the logical circuit 10. The processor information 4 includes the information regarding the external memory 11 and the target processor 12. The analyzing unit 6 analyzes the load and power consumption of the target processor described above, using both of the execution object 2 and the processor information 4.

(Processor Information)

The processor information includes the difference information between the real processor and the target processor 12.

Figure 4:
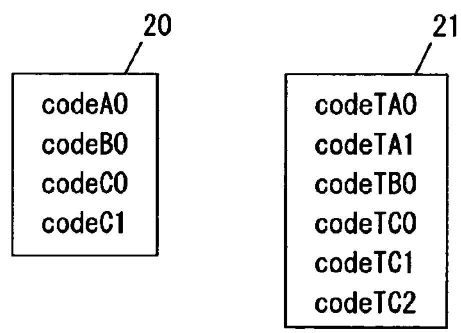
FIG. 4 is an exemplification diagram illustrating instruction codes of a processor in Embodiment 1 of the present invention.
Figure 5:
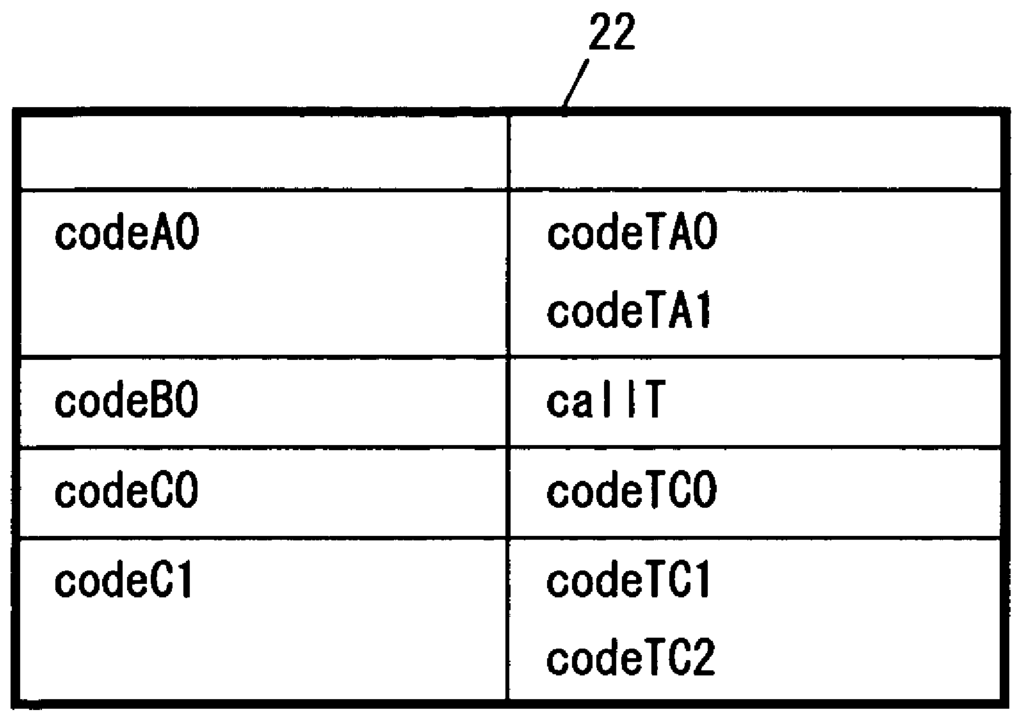
FIG. 5 is an exemplification diagram illustrating a conversion table used for replacement in Embodiment 1 of the present invention.

The difference information includes the replacement information indicative of replacement between instruction codes of the real processor and instruction codes of the target processor 12. FIG. 4 is an exemplification diagram illustrating instruction codes of the processors in Embodiment 1 of the present invention. FIG. 5 is an exemplification diagram illustrating a conversion table used for the replacement in Embodiment 1 of the present invention.

The instruction codes 20 are instruction codes of the real processor. The instruction codes 21 are instruction codes of the target processor 12. As shown in FIG. 4, the instruction codes of the real processor and the instruction codes of the target processor 12 are different. The processor information 4 possesses a conversion table 22 shown in FIG. 5.

The analyzing unit 6 analyzes the operation of the logical circuit, after converting the instruction codes of the real processor into the instruction codes of the target processor 12. At this time, the analyzing unit 6 analyzes the operation of the logical circuit using the conversion table 22 included in the difference information.

As shown in the conversion table 22, an instruction code "codeA0" of the real processor is converted into instruction codes "codeTA0" and "codeTA1" of the target processor 12. The analyzing unit 6 analyzes the operation of the logical circuit 10 using the instruction codes after conversion.

The instruction codes 20 and 21 shown in FIG. 4 and the conversion table 22 shown in FIG. 5 are examples. It is sufficient that the instruction codes and the conversion table should correspond to the classes of the real processor and target processor.

The difference information includes the replacement information indicating replacement between the address value which the real processor uses and the address value which the target processor 12 uses. Using the replacement information of the address values, the analyzing unit 6 can analyze the operation of the logical circuit 10 in the target processor 12 by the operation of the execution object 2 which operates on the real processor. Since the address value is replaced in the analysis, the logical circuit 10 operates in coordination with the target processor 12.

Such replacement of the instruction code and the address value may be performed by a unit of the replacement which is based on a unit of the processing at the time of execution of the execution object 2.

If the unit of the replacement is per one instruction, the replacement of the instruction code and the address value can be surely performed.

If the unit of the replacement is per one module included in the execution object 2, the replacement of the instruction code and the address value can be performed at high speed.

When loop processing is included in one unit of module, it is hard to grasp the sequence and contents of the instruction beforehand; therefore, it is suitable that the unit of the replacement should be per unit of processing excluding the part of the loop processing. Thereby, it is possible to realize the accurate and speedy replacement of the instruction code and the address value.

The difference information includes the difference between the information of the internal memory and internal cache which are possessed by the real processor and the information of the internal memory and internal cache which are possessed by the target processor 12. Specifically, the difference information includes the replacement information indicating replacement between the address value of the internal memory of the real processor and the address value of the internal memory 13 of the target processor 12. The difference information also includes the difference between the cache of the real processor and the cache 14 of the target processor 12.

Using the difference information regarding the internal memories, the analyzing unit 6 analyzes the frequency of access of the logical circuit 10 in accessing to the internal memory 13 included in the target processor 12. Through the analysis using the replacement information of the address value, it is possible to simulate the access of the logical circuit 10 to the internal memory 13 of the target processor 12.

Similarly, using the difference information regarding the cache, the analyzing unit 6 can analyze the frequency and hit ratio of the access to the cache 14 by the logical circuit 10.

The processor information 4 includes the information of the external memory 11 which the logical circuit 10 accesses. Specifically, the processor information 4 includes information such as the capacity, access speed, and address of the external memory 11.

Using the information regarding the external memory 11, the analyzing unit 6 analyzes the frequency of access of the logical circuit 10 in accessing to the external memory 11. Through the analysis of the frequency of access to the external memory 11, it is possible to analyze the power consumption of the application to be developed, commencing with the logical circuit 10.

Herein, the analyzing unit 6 analyzes the number of times of access per unit time in the access of the logical circuit 10 to the external memory 11. The power consumption per access is calculated from the operation voltage and I/O voltage of the LSI which the logical circuit 10 assumes, and the I/O voltage of the external memory 11 and so on. The analyzing unit 6 analyzes the power consumption due to the access of the logical circuit 10 to the external memory 11, by the multiplication of the number of times of access per unit time and the power consumption per access.

Similarly, the analyzing unit 6 analyzes the power consumption due to the access of the logical circuit 10 to the external memory 11 by the multiplication of the number of times of access per unit time and the power consumption per access to the external memory 11.

Moreover, the analyzing unit 6 analyzes the number of times of access per unit time from the logical circuit 10 to the target processor 12, and the number of waiting cycles at the time of access, and then analyzes the frequency of access of the logical circuit 10 to the target processor 12.

As described above, the frequency of access to the internal memory 13 and the cache 14 which are included in the target processor 12 is analyzed, through the access to the internal memory and the cache which are included in the real processor.

In addition, as for the logical circuit 10 included in the execution object 2, the frequency of access to the external memory 11 and the power consumption are analyzed. At this time, a virtual processor model which describes the detailed operation of the external memory 11 and/or the target processor 12 is unnecessary. The analysis can be completed only by the processor information 4 which is easy to describe, such as the difference information with the real processor. Thus, contrary to the prior art, the load and period for developing the virtual processor model which describes the detailed operation of the target processor are unnecessary.

Moreover, since the real processor performs the analysis based on the information of the target processor 12 and the memory 11, included in the processor information 4, the speed of the analysis becomes faster. Furthermore, since the same analysis as using the target processor 12 and the external memory is realized, the processing load of the target processor and the power consumption of the application can be estimated in high accuracy.

Figure 6:
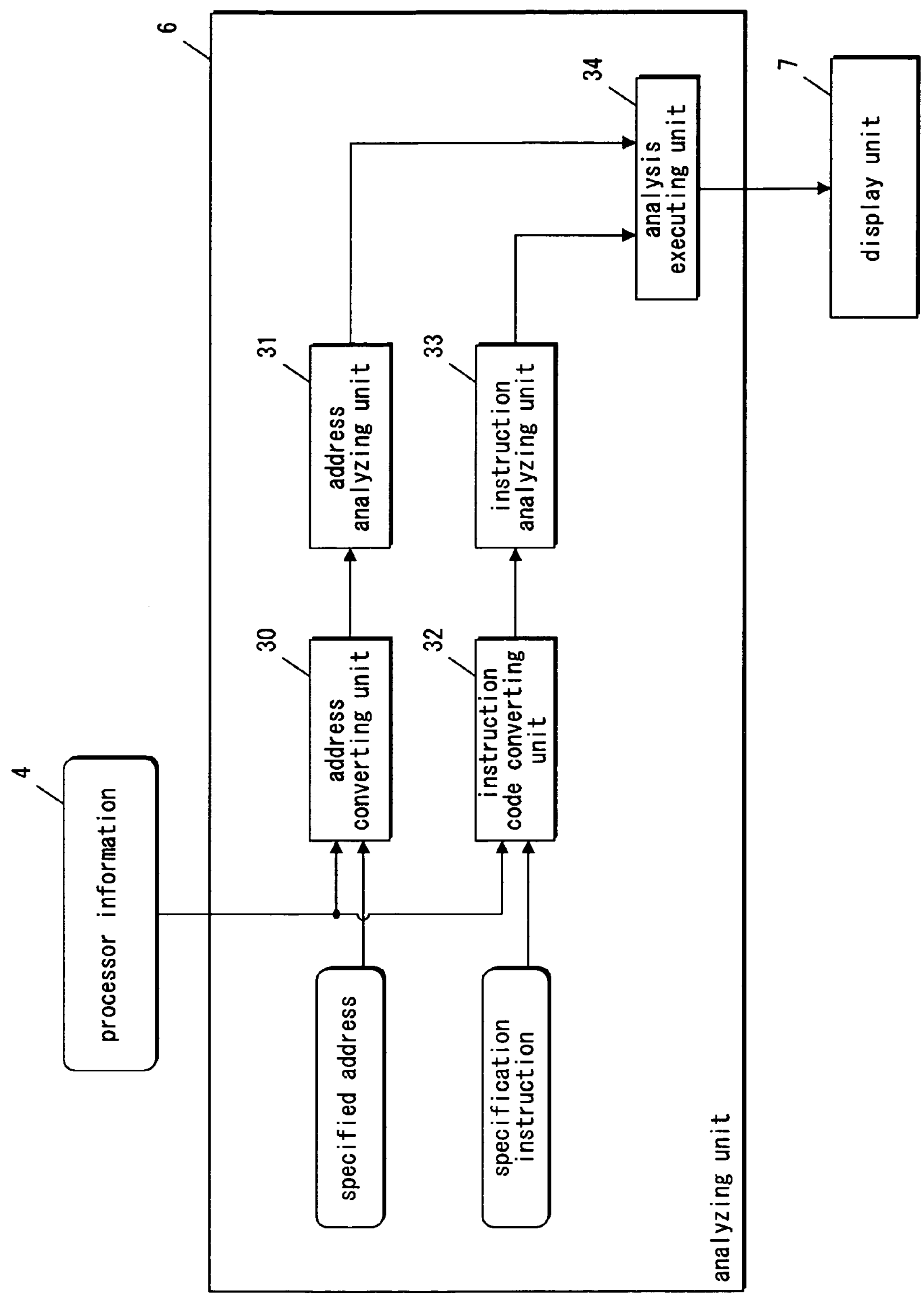
FIG. 6 is an internal-block diagram of an analyzing unit 6 in Embodiment 1 of the present invention.

Herein, the details of the analyzing unit 6 are explained referring to FIG. 6. FIG. 6 is an internal-block diagram of the analyzing unit 6 in Embodiment 1 of the present invention.

As clearly shown in FIG. 6, in order to analyze the operation of the logical circuit 10, based on the target processor 12, the analyzing unit 6 comprises internally an address converting unit 30, an address analyzing unit 31, an instruction code converting unit 32, an instruction analyzing unit 33, and an analysis executing unit 34.

Through the operation of the execution object 2, the address converting unit 30 converts a specified address which is an address value specified by the logical circuit 10, according to the conversion method of an address value included in the processor information 4. The address after conversion is an address corresponding to the target processor 12 (alternatively, the internal memory 13, or the cache 14 which is included in the target processor 12). The address analyzing unit 31 analyzes operation regarding the address specification of the logical circuit 10 based on the address after conversion.

Similarly, the instruction code converting unit 32 converts the instruction code specified by the logical circuit 10 into the instruction code corresponding to the target processor 12, using the conversion table 22 shown in FIG. 5. The instruction analyzing unit 33 analyzes operation regarding the instruction of the logical circuit 10 based on the instruction code after conversion.

The analysis executing unit 34 analyzes the access to the target processor 12 and the access to the external memory 11. The analysis result is displayed on a display unit 7.

The display unit 7 is a screen or liquid crystal display of a computer. The analysis result is displayed in an aspect in response to the request of a user. For example, the analysis result is displayed in the form of graph or table.

In spite of the fact that it is the real processor with substance that operates the execution object 2, it is possible to analyze the operation of the logical circuit based on the target processor 12 and external memory 11 which are assumed by the application, through the above-described analysis by the analyzing unit 6. The processor information eliminates the use of the virtual processor model in which the detailed operation of the target processor 12 is described. Thus, it is possible to make a high-accuracy estimation of the processing load of the target processor and the power consumption of the application, in early stage of development of the system LSI.

In addition, the circuit analysis device 1 may be provided as a dedicated device for the use of the above-described circuit analysis, or as a device that is operable on a general-purpose computer (including a personal computer and a work station).

Embodiment 2

Next, Embodiment 2 is explained referring to FIG. 1 and FIG. 2.

The circuit analysis device 1 may be constituted by software, in part or entirely. When realized by the software, the software is based on a circuit analysis method which possesses a function equivalent to the circuit analysis device 1.

The circuit analysis method includes a step of storing the execution object 2 which can operate on the real processor and possesses the function of the logical circuit 10.

Subsequently, the circuit analysis method includes a step of analyzing the operation which is based on the function of the logical circuit 10 and is coordinated with the target processor 12, through the operation of the execution object 2 on the real processor. In the circuit analysis method, the analysis is performed using the processor information 4 which includes the difference information between the real processor and the target processor. By use of the processor information 4, the operation of the logical circuit 10 can be analyzed in coordination with the target processor 12.

The analysis result is displayed, if needed.

Moreover, the function included in the circuit analysis device 1 or the circuit analysis method may be provided, in part or entirely, as a circuit analysis program that operates on the computer.

The circuit analysis program stores the execution object 2 which includes the function of the logical circuit 10 and is operable on the real processor in which the circuit analysis program is installed. Furthermore, the circuit analysis program analyzes the operation which is based on the function of the logical circuit 10 and is coordinated with the target processor 12, through the operation of the execution object 2 on the real processor. The circuit analysis program stores the difference information between the operation specifications of the real processor and the operation specifications of the target processor 12, and performs the above-described analysis using the difference information.

In other words, the operation of the logical circuit coordinated with the target processor which is assumed to be installed in the application is analyzed.

The circuit analysis program is converted into object codes that are operable on a computer. Then, the circuit analysis program is distributed via a network, or in the form of storage media such as CD-ROM and DVD-ROM.

The object codes received in these forms are installed in a computer for use by the user. Consequently, the circuit analysis becomes possible to be performed.

The circuit analysis device may be provided as a computer (including a personal computer, a work station, and so on) in which the circuit analysis program is installed to perform the analysis. As an alternative, the circuit analysis device 1 may be provided as a device of the exclusive use with which the circuit analysis can be practiced. As a further alternative, the circuit analysis device 1 may be provided as a circuit analysis simulator which operates on a computer. When the circuit analysis device 1 is provided as the circuit analysis simulator, it is suitable, from the viewpoint of usability, to include a display function to display the analysis result as well.

According to the circuit analysis device, the circuit analysis method, the circuit analysis program, and the circuit analysis simulator, which are mentioned above, the processing load and power consumption of the target processor can be estimated in high accuracy at the early stage of development of the system LSI.

Moreover, the access frequency between the logical circuit and the external memory or internal memory, and the communication load between the logical circuit and the target processor can be also estimated in high accuracy.

The development of the virtual processor model of the target processor 12, which is assumed by the application including the logical circuit 10, also becomes unnecessary. Thus, it is possible to perform the analysis in the early stage of development.

According to the present invention, it is not necessary to develop the detailed model of the target processor which the application assumes. In addition, the processing load of the target processor and the power consumption of the application can be estimated in high accuracy in the early stage of the development of the system LSI which realizes the application.

As a result, the back tracking in the final stage of development of the system LSI decreases remarkably. Thereby, it is possible to develop the system LSI in a short development period.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit analysis device comprising:

a first storing unit operable to store an execution object which can operate on a real processor and includes a function of a logical circuit;

a second storing unit operable to store processor information, including difference information indicative of a difference between operation specifications of the real processor and operation specifications of a target processor;

an analyzing unit operable to analyze, through execution of the execution object on the real processor, an operation that is based on the function of the logical circuit, using the processor information so as to emulate, on said real processor, an emulation of said operation by the target processor.

2. The circuit analysis device as claimed in claim 1, wherein the difference information includes replacement information indicative of code replacement between an instruction code of the real processor and an instruction code of the target processor.

3. The circuit analysis device as claimed in claim 1, wherein the difference information includes difference between specifications of an internal memory and an internal cache, both possessed by the real processor, and specifications of an internal memory and internal cache, both possessed by the target processor.

4. The circuit analysis device as claimed in claim 3, wherein said analyzing unit analyzes access frequency at which the logical circuit accesses at least one of the internal memory and the internal cache, both possessed by the target processor.

5. The circuit analysis device as claimed in claim 1, wherein the difference information includes replacement information indicative of address replacement between an address used by the real processor and an address used by the target processor.

6. The circuit analysis device as claimed in claim 1, wherein the processor information includes information of an external memory which is accessed by the logical circuit.

7. The circuit analysis device as claimed in claim 6, wherein said analyzing unit analyzes access frequency at which the logical circuit accesses the external memory.

8. The circuit analysis device as claimed in claim 1, wherein said analyzing unit analyzes communication frequency at which the logical circuit communicates with the target processor.

9. The circuit analysis device as claimed in claim 1, wherein said analyzing unit analyzes processing load and power consumption of the target processor.

10. The circuit analysis device as claimed in claim 1, further comprising:

a display unit operable to display an analysis result obtained by said analyzing unit.

11. A circuit analysis method comprising:

storing an execution object which can operate on a real processor and includes a function of a logical circuit;

storing processor information including difference information indicative of a difference between operation specifications of the real processor and operation specifications of a target processor; and analyzing, through execution of the execution object on the real processor, an operation that is based on the function of the logical circuit, using the processor information so as to emulate, on said real processor, an emulation of said operation by the target processor.

12. The circuit analysis method as claimed in claim 11, wherein the difference information includes replacement information indicative of code replacement between an instruction code of the real processor and an instruction code of the target processor.

13. The circuit analysis method as claimed in claim 11, wherein said analyzing performs analysis of communication frequency at which the logical circuit communicates with the target processor.

14. A computer-readable recording device on which a program is recorded, causing the computer to implement a method comprising:

storing an execution object which can operate on a real processor and includes a function of a logical circuit;

storing processor information including difference information indicative of a difference between operation specifications of the real processor and operation specifications of a target processor; and analyzing, through execution of the execution object on the real processor, an operation that is based on the function of the logical circuit, using the processor information so as to emulate, on said real processor, an emulation of said operation by the target processor.

15. The circuit analysis program as claimed in claim 14, wherein the difference information includes replacement information indicative of code replacement between an instruction code of the real processor and an instruction code of the target processor.

* * * * *